455-612 AU 233 EX

FIP8106 XR 3,170,067

Xerox copy

Feb. 16, 1965 L. U. KIBLER 3,170,067

SEMICONDUCTOR WAFER HAVING PHOTOSENSITIVE JUNCTION

Filed June 11, 1962

Various materials disclosed

INVENTOR
L. U. KIBLER
BY H. W. Lockhart
ATTORNEY 3,170,067
SEMICONDUCTOR WAFER HAVING PHOTO-SENSITIVE JUNCTION Lynden U. Kibler, Middletown, N.J., assignor to Bell Telephone Laboratories, Incorporated, New York, N.Y., a corporation of New York Filed June 11, 1962, Ser. No. 201,689
7 Claims. (Cl. 250—211)

This invention relates to optical communication systems and more particularly to an improved photodetector for such systems.

The term optical communication systems as used herein refers to systems involving electromagnetic radiations in the infrared, visible and ultraviolet frequency ranges. In such systems using laser or maser signal sources, detectors are required which can function in the gigacycle ($10^9$ cycles per second) range.

Therefore, an object of this invention is a high frequency photodetector capable of operation in optical communication systems.

In accordance with this invention, there is provided a photodetector in which the active region is defined between a pn junction produced by a substantially point contact element alloy-bonded within a thin high resistivity semiconductor layer produced by epitaxial deposition and the boundary of that layer. Thus, the minuteness of size required for operation in the gigagcyle range is achieved by the precise control of the thickness of high resistivity semiconductor layers offered by the epitaxial deposition method in combination with the alloy bonding process of a point contact element which enables close control of the location of a very small area pn junction. In one preferred embodiment, the semiconductor body is selectively etched to produce a cavity which enables impingement of the incident radiation more directly upon the active detecting region of the device.

As is well known, in high frequency devices satisfactory response is a function of the distances which must be traversed by the electric charge carriers within the material. In general, the shorter the distances to be traversed the higher the frequency response of the device. Another factor of vital importance is the electronic characteristics of the material of the device which determine the lifetime of the charge carriers therein. An additional factor in devices of this type is the barrier layer capacitance which is minimized in the device of this invention by reducing the pn junction area as noted above.

Heretofore, photodetectors both of the point contact and broad area pn junction semiconductor type have been known and used in communication systems even into the microwave frequency range, but typically in the megacycle range. It has, however, been difficult, insofar as applicant is aware, to use a photodetector above the frequency of 1 gigacycle. It has been determined, in accordance with this invention, that a photodetector suitable for operation above this frequency may comprise a semiconductor wafer having a very thin high resistivity layer, typically from 4 to about 10 microns thickness, in the form of a mesa on a semiconductor wafer. Within this high resistivity layer a pn junction is made by alloy bonding a point contact element which penetrates approximately half-way through the high resistivity film. There is formed thereby an active detecting region comprising that portion immediately beneath the alloy bonding element and extending to the boundary between the high resistivity film and the original portion of the semiconductor wafer. Optical signals of high frequency are satisfactorily detector when they are incident upon the device in a manner to impinge into this active region. In a preferred embodiment, the original portion of the semiconductor wafer is hollowed out opposite the alloy-bonded element, by selective etching, to produce a cavity reaching to just short of the boundary of the epitaxial film layer. In this embodiment, light impinges on the bottom of the cavity and therefore more directly upon the active detecting region.

Moreover, in structures using coherent light sources, it is possible to focus the light into volumes comparable to the wavelength of transmission. For effective use in such an arrangement, the active region of the detector should likewise have a volume comparable to the light beam. Insofar as applicant is aware, the technique of this invention is the only practicable one for making active regions of such dimensions. In certain instances, it is desirable to provide a deposited high resistivity layer of of 2 microns thickness. By alloying into this 2 micron layer an active region of about 1 micron thickness may be fabricated.

Thus a feature of the photodetectors of this invention is a semiconductor wafer having a thin high resistivity layer in which a detecting region is defined beneath a substantially point contact element which is alloy-bonded partially through the thin layer.

The invention and its other objects and features will be understood more clearly from the following description taken in conjunction with the drawing in which.

Figure 1:
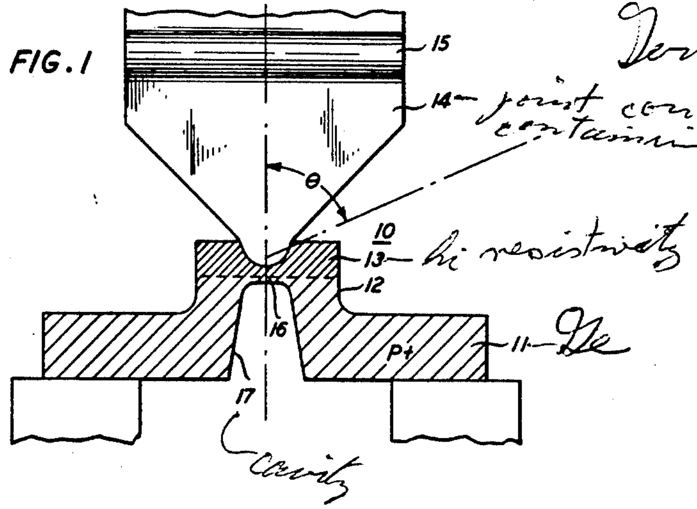
FIG. 1 shows a preferred embodiment of the semiconductor photodetector in partial section.

Referring to FIG. 1, the photodetector 10 comprises a base wafer 11 of low resistivity (p+ type) germanium having a raised or mesa portion 12 which is composed in part, at the top thereof, of a high resistivity layer 13. A point contact element 14 of gold foil containing a small amount of arsenic is bonded approximately half-way into the layer 13, typically by electrical pulsing of the point contact element. The point contact element has some resiliency because of a curved portion 15 indicated by the shading in FIG. 1 and as shown by the side views of FIGS. 2 and 3.

Typically, the layer 13 is between 4 and 10 microns in thickness and the signal to be detected may be impinged upon the detecting region 16 by directing the light thereinto from the top surface of the mesa portion immediately along side the periphery of the point contact element 14. In particular, for optimum performance, the incident radiation, which may be a beam of coherent light, is polarized in substantially the same plane as the foil member 14 and at an angle $\theta$ to the vertical axis thereof equal to Brewster's angle.

However, in an improved and preferred form of the device a cavity 17 is produced in the original portion of the semiconductor wafer. This cavity 17 penetrates to just short of the boundary between the layer 13 and the base portion 11. The magnitude of this spacing is determinitive of the bias which can be applied across the device inasmuch as the existence of a space charge region within this spacing is essential to operation. Typically, for a bias of about 1.5 volts direct current, this spacing between the high resistivity layer boundary and the bottom of the cavity is about 100 Angstroms.

In one typical embodiment, the base or original portion of the wafer has a diameter or extreme width of from 20 to 40 mils and a thickness of about 3 mils. The epitaxial layer 13 has a thickness of about 8 microns and the mesa portion a width of about .9 mil. The cross-section of the alloy-bonded region at its extreme width in the epitaxial layer is approximately 4 microns, and the width of the cavity 17 near the endmost point is about .5 to 1 mil. A device of this general configuration may be expected to detect optical signals in the 25 to 50 gigacycle range.

One specific method for fabricating the device described above involves first the preparation of the original germanium semiconductor material of low resistivity (.001 ohm-centimeter) p-type conductivity. This material is in slice form, about one-half inch diameter and 10 to 20 mils thick. One side of the slice is prepared by standard polishing techniques and then a thin layer of high resistivity germanium is epitaxially deposited thereon. One typical method for epitaxially depositing semiconductor material is disclosed in application Serial No. 35,152 of Kleimack, Loar and Theuerer, filed June 10, 1960, and assigned to the assignee of this application. This epitaxial layer has a resistivity of about 40 ohms-centimeter and a thickness from 4 to 10 microns. Although the material is described herein in terms of particular resistivities, it is of at least equal importance that the several portions of the material exhibit particular relative charge carrier lifetimes. For optimum performance the high resistivity layer, particularly, in the active region under the alloyed portion, should have high carrier lifetime to enable movement of carriers thereacross with a minimum of recombination. In the low resistivity substrate layer, on the other hand, carrier lifetime should be low to reduce forward resistance.

The use of the gold foil element to form the small area pn junction affords the additional advantage of reducing lifetime in the n-doped germanium alloy region. In some specific structures it may be found advantageous to treat the several portions of the photodetector by ways well known in the art to enhance or reduce minority carrier lifetime in accordance with the criteria set forth herein.

In the particular embodiment herein the high resistivity (40 ohms-centimeter) layer advantageously has a minority carrier lifetime of about $10^{-3}$ seconds and the low resistivity (.001 ohm-centimeter) substrate has a lifetime of less than about $5 \times 10^{-11}$ seconds.

This epitaxial surface then is masked and etched to produce an array of mesas and then to enable separation of the slice structure into a plurality of individual wafers.

The rectifying connection then is made to the mesa of each individual wafer using a 3 mil wide ribbon of gold foil having a thickness of about .6 mil which is tapered to a sharp point by cutting with fine scissors under high magnification. This point contact element contains a small percentage (about 1 to 4 percent) of a donor impurity such as arsenic or antimony.

After placing the point contact element on the top surface of the mesa, a square voltage pulse of 4.2 to 4.6 volts and about 10 microseconds duration, for a layer about 8 microns thick, is passed between the point and the semiconductor to produce the alloy-bonded pn junction structure as described above. Finally, the original portion of the wafer is subjected to a conventional jet etching technique such as disclosed, for example, in Patent 2,912,371 to produce the cavity 17 in alignment with the alloy-bonded element.

The alloy-bonded structure may be stabilized during this etching procedure by the application of an epoxy to the mesa surface surrounding the point. Moreover, this epoxy may be left in place permanently without substantial deleterious effect to improve the ruggedness of the device. In an alternative procedure, the cavity 17 may be produced first followed by the alloy-bonding operation.

The device then is provided with terminal electrodes in a conventional manner to enable mounting and use as described, for example, hereinafter. Further, although the photodetector has been described in terms of germanium semiconductor material, other semiconductors such as silicon and the Group III-Group V semiconductors also may be used.

In connection with the use of particular semiconductor material, there is the important criterion of matching the absorption edge value of the material to the particular radiation being detected to enable optimum performance. Moreover, photodetector structures advantageously may include more than one elemental or compound semiconductor. For example, a photodetector for radiation from a ruby laser at 7000 Angstroms may comprise a thin high resistivity layer of gallium arsenide on a substrate of gallium phosphide. For this device the alloy-bonded element typically is of cadmium. Another detector useful for emission from a helium-neon laser at 1.153 microns may include a high resistivity layer of germanium on a gallium arsenide substrate.

Also, it will be understood that although the foregoing specific embodiment refers to particular conductivity types, p+ for the substrate, and high resistivity p ($\pi$) for the thin layer, and an n-doped alloying element, the reverse arangement of an n+, $\nu$, and p-doped element can be used.

Figure 2:
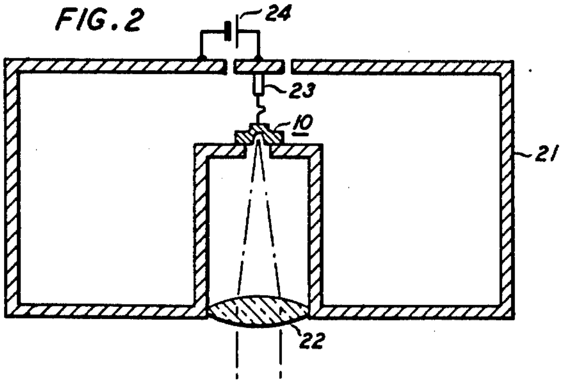
FIG. 2 shows in schematic form the installation of the photodetector in a ridged waveguide shown in section.

In FIG. 2 the semiconductor photodetector 10 is shown installed on top of the ridged portion of a waveguide element having a lens 22 for focusing the input signals into the cavity. In the photodetector, the point contact element is shown secured to a pin 23, and a biasing source 24 is shown schematically to indicate a particular application of the device.

Figure 3:
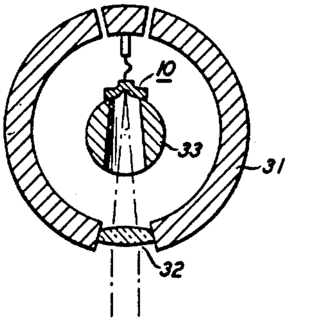
FIG. 3 similarly shows the photodetector in a coaxial type of conductor.

FIG. 3 depicts another type transmission element in which the photodetector 10 may be employed. In this instance the lens is provided in an orifice in the outer conductor 31, and the inner conductor 33 has a tapered hole therein for admitting the optical signal to the cavity of the photodetector.

Although the invention has been described in terms of particular embodiments, it will be understood that other modifications may be made by those skilled in the art which will be within the scope and spirit of the invention.

What is claimed is:

1. A signal translating device responsive to signals in the optical range comprising a germanium semi-conductor wafer substantially of one conductivity type having a mesa portion on one surface thereof, said mesa portion comprising a high resistivity epitaxially-deposited germanium layer having a thickness of between 4 and 10 microns, said layer having therein a small area pn junction located approximately one-half way through the thickness of said layer, the opposite surface of said wafer having a cavity therefrom in alignment with said small area pn junction, said cavity extending to just short of the boundary of said high resistivity layer, thereby defining an active detecting region between said junction and the opposite boundary of said layer, the minority carrier lifetime, in said mesa portion being relatively high compared with that of the remainder of said wafer.

2. In an optical communication system a signal translating device; in accordance with claim 1 in combination with means adjacent to said signal translating device for focusing optical signals within said cavity.

3. In an optical communication system a portion of a coaxial transmission element having a signal translating device in accordance with claim 1 mounted therein, and means adjacent to said signal translating device for focusing optical signals within the cavity of said device.

4. A signal translating device responsive to signals in the optical range comprising a semiconductor wafer substantially of one conductivity type having a mesa portion on one surface thereof, said mesa portion comprising a high resistivity epitaxially-deposited semiconductor layer having a thickness of between 4 and 10 microns, said layer having therein a small area pn junction located approximately one-half way through the thickness of said layer, the opposite surface of said wafer having a cavity therefrom in alignment with said small area pn junction, said cavity extending to just short of the boundary of said high resistivity layer, thereby defining an active detecting region between said junction and the opposite boundary of said layer, the minority carrier lifetime in said mesa portion being relatively high compared with that of the remainder of said wafer.

5. In an optical communication system a signal translating device in accordance with claim 4 in combination with means adjacent to said signal translating device for focusing optical signals within said cavity.

6. In an optical communication system a portion of a coaxial transmission element having a signal translating device in accordance with claim 4 mounted therein, and means adjacent to said signal translating device for focusing optical signals within the cavity of said device.

7. A signal translating device in accordance with claim 4 in which the wafer and the high resitivity layer are of different semiconductor materials.

References Cited in the file of this patent

UNITED STATES PATENTS

| | | |
|---|---|---|
| 2,644,852 | Dunlap | July 7, 1953 |
| 2,669,635 | Pfann | Feb. 16, 1954 |
| 2,691,736 | Haynes | Oct. 12, 1954 |
| 2,985,805 | Nelson | May 23, 1961 |
| 3,089,788 | Marinace | May 14, 1963 |